US008841746B2

(12) United States Patent
Rathi et al.

(10) Patent No.: US 8,841,746 B2
(45) Date of Patent: Sep. 23, 2014

(54) ON-DIE PROGRAMMING OF INTEGRATED CIRCUIT BOND PADS

(71) Applicant: LSI Corporation, San Jose, CA (US)

(72) Inventors: Akhilesh Rathi, San Jose, CA (US); Arvind Shrivastava, Pune (IN)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/776,893

(22) Filed: Feb. 26, 2013

(65) Prior Publication Data

US 2014/0240033 A1 Aug. 28, 2014

(51) Int. Cl.
*H01L 21/108* (2006.01)
*H01L 21/44* (2006.01)

(52) U.S. Cl.
USPC .......................................... 257/530; 438/600

(58) Field of Classification Search
USPC .......... 438/131, 467, 600, 957; 257/529, 530, 257/E23.147
See application file for complete search history.

(56) References Cited

U.S. PATENT DOCUMENTS

| 6,184,703 | B1 | 2/2001 | Vest et al. | |
|---|---|---|---|---|
| 7,723,820 | B2 * | 5/2010 | Kim et al. | 257/530 |
| 8,242,578 | B2 * | 8/2012 | Basker et al. | 257/530 |
| 2012/0061796 | A1 | 3/2012 | Wang | |

* cited by examiner

*Primary Examiner* — Calvin Lee
(74) *Attorney, Agent, or Firm* — Suiter Swantz pc llo

(57) ABSTRACT

SoC and SiP designs are configured with an antifuse link within the die to allow on-die programming of bond wires connecting package lead fingers to the bond pads on the die. This permits alteration of the bond pad connections for the die, particularly for the ground voltage ground signal (VSS) connections on the bond pad, at the testing stage after the die package and the power supply have been installed on the PCB. On-die programming of antifuse link allows the VSS bond pad connections to be reconfigured, typically to eliminate long bond wire runs to reduce ground bounce and simultaneous switching output (SSO) noise, after assembly and field testing of the integrated circuit. Antifuse programming is completed by applying the programming voltage to the programming pad of the antifuse.

16 Claims, 2 Drawing Sheets

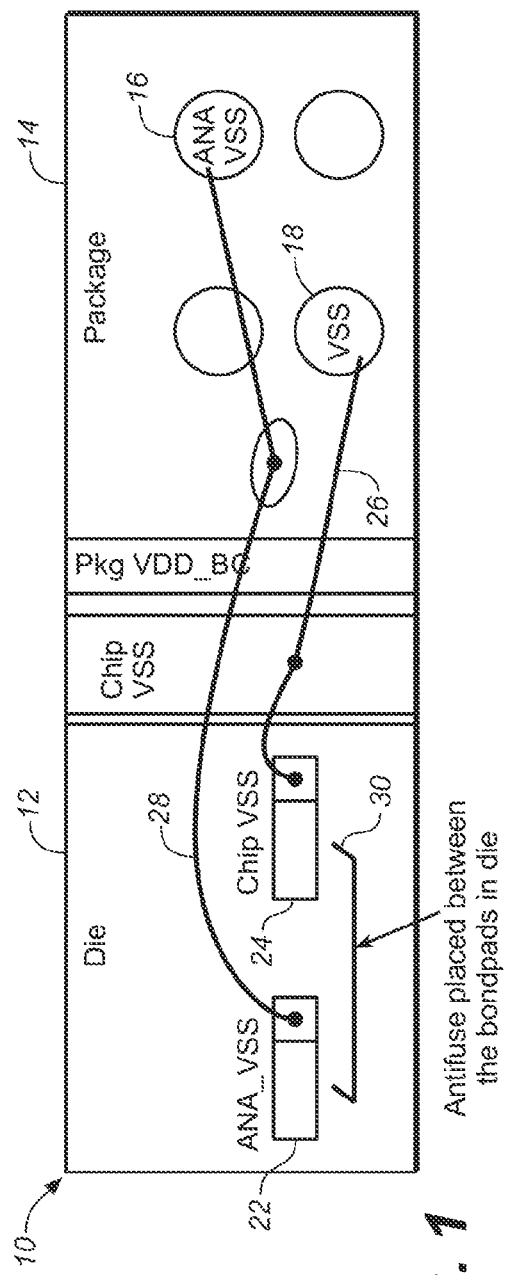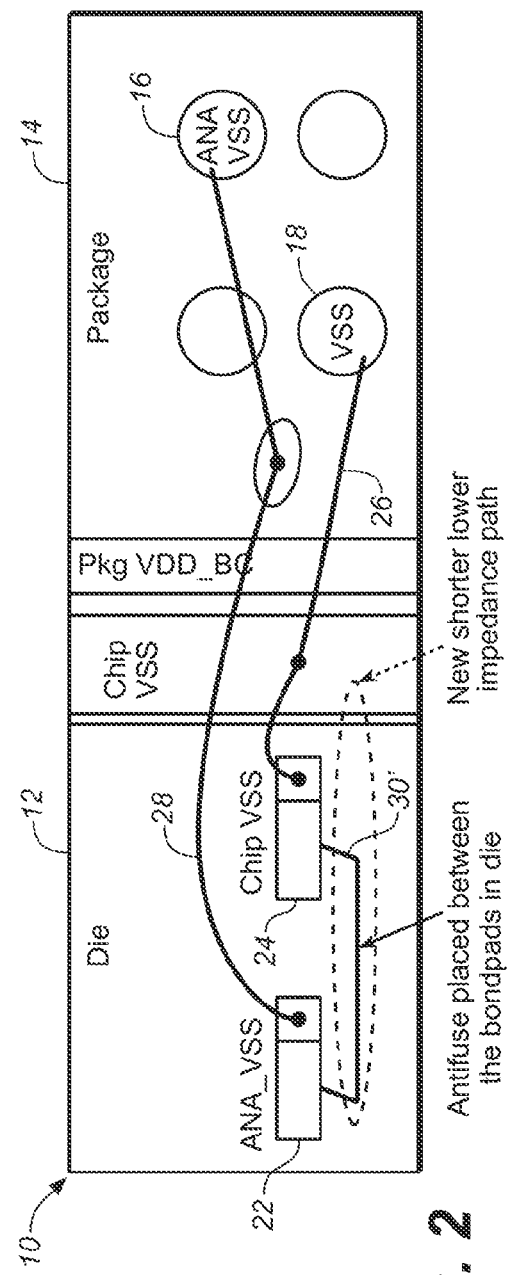

ON-DIE PROGRAMMING OF INTEGRATED CIRCUIT BOND PADS

TECHNICAL FIELD

The present invention relates to computer integrated circuits and, more particularly, to on-die antifuse programming of bond pad in System-On-a-Chip (SoC), when a BGA package is used to encapsulate the SoC, to provide in-field capability to reduce ground bounce problems discovered during the SoC silicon testing or validation stage.

BACKGROUND

A System-On-a-Chip (SoC) system is an integrated circuit (IC) that integrates all components of a computer or other electronic system into a single chip. It may contain digital, analog, mixed-signal, and often radio-frequency functions—all on a single chip substrate. The term "package" refers to the material added around a component or integrated circuit (SoC) to allow it to be handled without damage and incorporated into a circuit. A ball grid array (BGA) package is a type of surface-mount packaging used for integrated circuits. The "die" refers to the IC chip itself and a "bond pad" refers to a soldering location on the die for connecting a lead finger of a BGA package to the die using a bond wire. The term "ballmap" refers to the mapping of bond pads to the lead fingers of the BGA package. The ballmap also typically includes mapping for signal and power (VDD/VSS). A ballmap drawing usually includes at least a die, a package, and the mapping connecting the appropriate bond pads to the lead fingers of BGA package. System in Package (SiP) designs generally refer to the integration of multiple IC chips into a larger package to create a large scale system located on a common printed circuit board (PCB).

The semiconductor industry is under increasing pressure to reduce power requirements, down-size devices, leverage advanced technology, and create multi-function devices. The industry-wide roadmap for integrated circuit design has been to reduce size, reduce power supply voltage, reduce cost and increase circuit density. Semiconductor packaging must keep pace to support these continually changing design objectives. BGA package offers cost effective option compared to other package technologies like Flip Chip, however bond wires, specially long bond wires, in BGA packages gives higher inductance, this makes system susceptible to noise. With continual reductions in operating voltages to meet lower power requirements, noise margins have also decreased, leaving the devices increasingly susceptible to electrical noise. Noise suppression therefore becomes more challenging with advancements in integrated circuit capabilities, potentially presenting a limiting factor for certain design advancements.

Ground bounce and switching ground noise at the power supplies for high switching rate devices, such as memory clock signals, can be primary sources of electrical noise. Noise generation and the sensitivity of the circuits to noise tend to increase as the memory clock signal rate increases. Reducing electrical noise in general, and reducing power supply ground bounce and switching ground noise in particular, are therefore increasingly important design objectives to support decreasing operating voltages and increased memory and other circuit clock rates.

There is, therefore, a continuing need for improved integrated circuit design techniques for reducing size, reducing power supply voltage, increasing circuit clock rates, and increasing circuit density. More particularly, there is a continuing need for reducing power supply ground bounce and switching ground noise in order to accommodate reduced noise margins, reduced power supply voltages, and increased memory clock rates.

SUMMARY

The needs described above are met in SoC and SiP designs that are configured with one or more antifuse links within the die to allow on-die programming of bond wires, connecting package lead fingers to the bond pads on the die. This permits alteration of the bond pad connection for the die, particularly for the ground voltage ground signal (VSS) bond pad, at the testing stage after the die, package and the power supply have been installed on the PCB. On-die programming of the antifuse links allow the VSS bond pads connections to be reconfigured, typically to eliminate long bond wire runs to reduce ground bounce and simultaneous switching output (SSO) noise, after assembly and field testing of the integrated circuit. Antifuse programming is completed by applying the programming voltage to the programming pad of the antifuse.

For example, the antifuse programming of the antifuse links connecting the ground to one or more of the VSS bond pads allow rerouting of the VSS ground bond wires on the die to avoid long bond wire routing when the die is installed in a ballmap that was not originally optimally designed for the particular die. This allows the power supply bond wires to be rerouted in response to ground bounce or other performance concerns determined at the testing stage. Antifuse programmability also allows standard, field programmable die connections to be used to accommodate the same type of die in different ballmap configurations.

In an illustrative embodiment, the antifuse links are used to reduce ground bounce and ground switching noise suffered by VSS ground connections to sensitive power supplies due to bond wire impedance and simultaneous switching output (SSO) noise coupling. This is achieved by programming antifuse links built into the die to configure the connections to one or more VSS bond pads after the die has been installed on the PCB. In particular, an alternate antifuse path through the die can be programmed in the field to replace a long bond wire connection to provide shorter and lower impedance ground connection. This results in improvement in debug efforts for ground bounce and noise coupling issues using standard complementary metal-oxide semiconductor (CMOS) processes which, in turn, reduces the time to market with no extra cost.

Electronic design automation (EDA) tools are conventionally used to estimate the ground bounce during the design phase, but these tools may not be sufficiently accurate to eliminate ground bounce problems. As a result, antifuse programming can be used to reduce ground bounce problems discovered during the silicon validation phase. Without antifuse programming capability, fixing ground bounce problems late in the product cycle can be very expensive in terms of market window and engineering efforts required in terms of redesign of die or package. With the antifuse approach, alternate bond pad links can be programmed in-field, after the die has been installed on the PCB, to make on-the-fly changes in the bond pad connection routing to improve the electrical properties caused by long bond wires. In an embodiment of the invention, a one-time programmable (OTP) antifuse is programmed by applying the programming voltage to the existing VSS pins to short the ANA-VSS pin of the SoC to an alternate ground source, such as another ground bond pad on the die. In this manner, the ground bounce and switching ground noise attributable to the long bond wire run can be shorted to ground without re-spin of the SoC.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE FIGURES

The numerous advantages of the invention may be better understood with reference to the accompanying figures in which:

FIG. 1 is a conceptual block diagram of an SoC and package using a long bond wire connection prior to antifuse programming.

FIG. 2 is a conceptual block diagram of the SoC and package after antifuse programming to replace the long bond wire connection with a programmed antifuse connection on the die.

DETAILED DESCRIPTION OF ILLUSTRATIVE EMBODIMENTS

Figure 3:
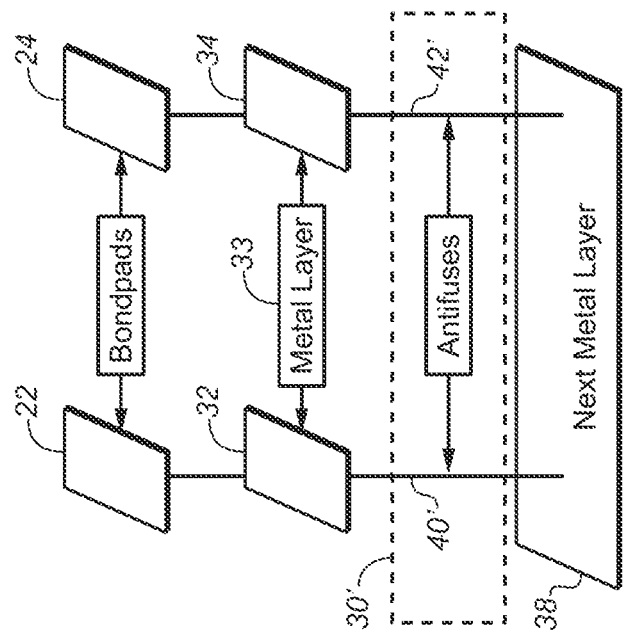
FIG. 3 is an exploded conceptual illustration of the SoC and package using the long bond wire connection prior to antifuse programming.

The invention may be embodied in SoC and SiP circuit designs that utilize one or more OTP antifuse on the die for on-die programming of the power supply ground bond pads to reduce ground bounce and other noise concerns identified during the silicon testing and validation phase. In particular, in-field programming of the OTP antifuse may be used to reroute the VSS bond pad connections to reduce the impedance of the VSS ground lines. For example, an antifuse link can be programmed to short the isolated power supply ground (ANA-VSS) bond pad to the SoC ground (chip-VSS) bond pad on the die to eliminate a long bond wire connection from the isolated power supply in the package providing the power supply for the ANA-VSS bond pad on the die. The antifuse link is programmed, for example, when it is found during silicon validation that the ANA-VSS connection is suffering from ground bounce due to high impedance or simultaneous switching output noise. Eliminating the long bond wire from the ANA-VSS output on the package providing the power supply to the ANA-VSS bond pad on the die through programming the antifuse running in the die lowers the ground impedance to reduce ground noise discovered through in-field testing after package fabrication.

As one example, the ground for the isolated power supply (ANA-VSS) may be located in the outer rows of the package. For this design, the corresponding ANA-VSS bond pad on the die must ordinarily be placed on the inner ring of the die because of package design rules. This placement requires a lengthy bond wire.

A long bond wire in the power supply ground leg typically results in high impedance on the ANA-VSS connection. The longer bond wire, the higher the inductance in path for the isolated supply ground ANA-VSS. The higher impedance makes the ANA-VSS more susceptible to ground bounce, particularly when there is high switching activity on nearby high speed signals. Ground bounce on the isolated power supply ground, in turn, results in reduced noise margin in the power supply domain, which can make the behavior of circuit working on this power supply to be unpredictable. For example, the phase loop lock (PLL) clock signal may unlock due to noise on its supply.

Conventional design techniques use system level simulations performed at the PCB level to check the ground bounce. This type of simulation for high speed interfaces, such as clock signals for double data rate random access memory (DDR), requires accurate modeling of the die, package, PCB and DRAM. The model should also simulate extraction of power (VDD, VSS) to create an accurate model. Unlike real analog signals, EDA extraction tools use simple algorithms for modeling power signals due to the complex structures of these circuits. As a result, simulation accuracy for effects like ground bounce is limited and improving the accuracy of the model is very difficult and tedious, making a highly accurate model simulation impractical to develop in a sufficiently timely fashion to support the desired design cycle. With available EDA modeling tools, the magnitude of the ground bounce effects is limited and usually not conclusive to rule out possibility of ground bounce issues.

FIGS. 1-4 illustrate an example technique using programmable antifuse links to program the bond pads on the die to provide a solution for these situations. OTP antifuse programming for existing VSS bond pads on the die provides a mechanism for rerouting the power supply bond wires in-field without having to re-spin the SoC. In this proposal, the standard CMOS processes are used to implement antifuse programming technique to debug ground bounce and reduce the VSS impedance of the power supply.

On-die OTP antifuse programming for the isolated power supply ground bond pads represents a significant improvement allowing in-field bond wire rerouting to reduce ground bounce and noise coupling without package redesign or SoC re-spin. This provides a novel and improved approach that saves time and money by a avoiding need for package redesign or re-spin of the SoC when in-field testing reveals ground bounce or other ground noise problems that were missed at the model simulation stage.

To provide an illustrative application of the invention, FIG. 1 is a block diagram of a conceptual block diagram of an SoC and package 10 that includes a die 12 and a package 14 with a provisioned antifuse link 30 in the die prior to antifuse programming and a long bond wire connection prior to antifuse programming. The package 14 includes an isolated power supply ground ANA-VSS 16 and a chip power supply ground VSS 18. The die 12 includes an ANA-VSS bond pad 22 that needs to be connected to the isolated power supply ground ANA-VSS 16 on the package; and a chip-VSS bond pad 24 that needs to be connected to the chip power supply ground (VSS) 18 on the package. A relatively short bond wire 26 connects the chip power supply ground VSS 18 in the package to the chip-VSS bond pad 24 on the chip. A much longer bond wire 28 is required to connect the isolated power supply ground ANA-VSS 16 in the package to the isolated power supply ground ANA-VSS bond pad 22 on the die. The long bond wire 28 can impose sufficient impedance to cause ground bounce on the ANA-VSS ground leg and pick up extraneous switching noise from other components.

An OTP antifuse 30, running in the die 12 is provided to short the ANA-VSS bond pad 22 to the chip-VSS bond pad 24 on the die. Shorting of the bond pads 22 and 24 provides a much shorter path to ground for the isolated power supply ground leg connected to the ANA-VSS bond pad 22. FIG. 1 shows the SoC and the package 10 before the antifuse 30 has been programmed.

FIG. 2 is a conceptual block diagram of the SoC and the package 10 after the antifuse 30 has been programmed to short the long bond wire 28 connection with a programmed antifuse link 30' on the die. High programming voltage can be used to program the antifuse by placing the appropriate high voltage required to program the antifuse link on primary port of SoC. This allows the isolated power supply ground leg connected to the ANA-VSS bond pad 22 on the die to be rerouted (i.e., by shorting the long bond wire 28 with the programmed antifuse connection 30') without having to redesign the package or re-spin the SoC.

FIG. 3 is an exploded conceptual illustration of the die 12 illustrating the antifuse 30 at the IC layer level. The first bond pad 22 is located above a first portion 32 of a metal layer 33 on the die. The bond pad 24 is similarly located above a second portion 34 of the metal layer 33, which is electrically isolated from the top metal layer 32. The antifuse 30 includes a first antifuse link 40 located between the first portion 32 of a metal layer 33 and the next metal layer 36 in the die along with a second antifuse link 42 located between the second portion 33 of a metal layer 33 and the next metal layer 36. FIG. 3 shows the situation before the antifuse links 40-42 are programmed, open prior to programming.

Figure 4:
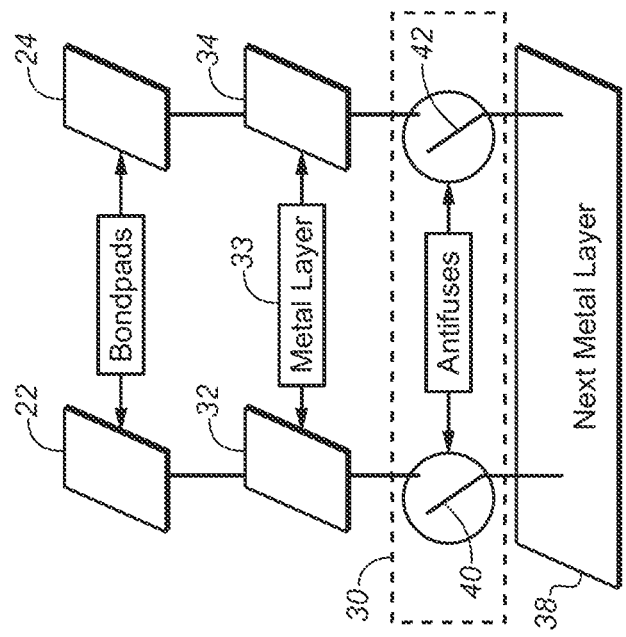
FIG. 4 is an exploded conceptual illustration of the SoC and package after antifuse programming to replace the long bond wire connection with a programmed antifuse link on the die.

FIG. 4 is an exploded conceptual illustration of the SoC and the package 10 after antifuse programming to replace the long bond wire 28 with the programmed antifuse link 30' running in the die. The high voltage signal required to program the antifuse link 40 is applied to the corresponding pin on the SoC connected to the first bond pad 22 to close the first antifuse link 40, which is shown after programming as the closed antifuse link 40' as part of the closed antifuse connection 30'. Similarly the high voltage signal required to program the second antifuse link 42 is applied to the corresponding pin on the SoC connected to the second bond pad 24 to close the second antifuse link 42, which is shown after programming as the closed antifuse link 42'. This selectively connects the bond pads 22-24 together through the programmed antifuse connection 30', which shorts the long bond wire 28 to effectively remove it from the ground leg. The bond wire 28 may also be cut or de-soldered and physically removed from the package. Although the antifuse connection 30' is shown as connected through the next layer down 38 from the top metal layer 33, it will be appreciated that vias or other IC connection techniques may be utilized to route the antifuse connection through other layers, as desired.

The present invention may include (but not required to include) adapting or reconfiguring presently existing systems. Alternatively, original equipment may be provided embodying the invention.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that any optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/ or quantities). A typical data processing system may be implemented utilizing any suitable commercially available components, such as those typically found in data computing/ communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims. Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. An integrated circuit comprising a programmable antifuse link, comprising:
    a printed circuit board;
    an integrated circuit die and a package comprising a power supply carried by the printed circuit board;
    the package having first and second power supply lead fingers;
    the die comprising first and second bond pads configured for connection to respective first and second power supply lead fingers on the package;
    a first bond wire connecting the first power supply lead finger of the package to the first bond pad of the die; and
    an antifuse link located within the die selectively connecting the first and second power supply bond pads for electrically connecting the first and second power supply bond pads together, wherein the antifuse link includes:
        a first electrical connection to the first bond pad via a first portion of a first metal layer within the die,
        a second electrical connection to the second bond pad via a second portion of the first metal layer, wherein the first and second portions of the first metal layer are electrically isolated from each other;
        a first programmable connection between the first portion of the first metal layer and a second metal layer within the die; and
        a second programmable connection between the second portion of the first metal layer and the second metal layer, wherein the second metal layer electrically connects the first and second programmable connections together.

2. The integrated circuit of claim 1, wherein the antifuse link is configured for programming by applying a predefined voltage to an SoC (system-on-a-chip) primary port.

3. The integrated circuit of claim 1, wherein the antifuse link is connected between the first and second bond pads through a metal layer within the die.

4. The integrated circuit of claim 1, wherein:
    the first programmable connection is selectively closable by applying a predefined voltage to the first power supply pin on the die; and
    the second programmable connection is selectively closable by applying a predefined voltage to the first power supply pin on the die.

5. The integrated circuit of claim 1, wherein the antifuse link provides a physically shorter and lower impedance electrical path between the second bond pad and electrical ground than a bond wire between the second power supply lead finger on the package and the second bond pad on the die.

6. The integrated circuit of claim 1, wherein the first and second power supply pins on the die are electrical ground pins.

7. The integrated circuit of claim 1, wherein the integrated circuit comprises a system-on-a-chip package.

8. The integrated circuit of claim 1, wherein the antifuse link is a one-time programmable antifuse link.

9. The integrated circuit of claim 1, wherein the package is a surface mount package.

10. The integrated circuit of claim 1, wherein the package is a ball grid array package.

11. The integrated circuit of claim 1, wherein the antifuse link is electrically open prior to programming to close the link.

12. The integrated circuit of claim 11, wherein the antifuse link is electrically closed after programming to close the link.

13. The integrated circuit of claim 1, wherein the first bond pad is an isolated power supply bond pad.

14. The integrated circuit of claim 13, wherein the isolated power supply bond pad connects to an isolated power supply ground of the package.

15. The integrated circuit of claim 1, wherein the second bond pad is a chip power supply bond pad.

16. The integrated circuit of claim 15, wherein the chip power supply bond pad connects to a chip power supply ground of the package.

* * * * *